United States Patent
Yu

(10) Patent No.: US 10,333,034 B2
(45) Date of Patent: Jun. 25, 2019

(54) PHOSPHOR AND LIGHT EMITTING DEVICE AND BACKLIGHT MODULE INCLUDING THE SAME

(71) Applicant: AmTRAN Technology Co., Ltd., New Taipei (TW)

(72) Inventor: Hung-Ta Yu, New Taipei (TW)

(73) Assignee: AmTRAN Technology Co., Ltd., New Taipei (TW)

( * ) Notice: Subject to any disclaimer, the term of this patent is extended or adjusted under 35 U.S.C. 154(b) by 250 days.

(21) Appl. No.: 15/458,022

(22) Filed: Mar. 14, 2017

(65) Prior Publication Data

US 2018/0190879 A1 Jul. 5, 2018

(30) Foreign Application Priority Data

Dec. 29, 2016 (TW) ............... 105143982 A

(51) Int. Cl.
| | |
|---|---|
| *C09K 11/08* | (2006.01) |
| *C09K 11/61* | (2006.01) |
| *C09K 11/77* | (2006.01) |
| *H01L 25/16* | (2006.01) |
| *H01L 33/50* | (2010.01) |

(52) U.S. Cl.
CPC ........ *H01L 33/502* (2013.01); *C09K 11/0883* (2013.01); *C09K 11/616* (2013.01); *C09K 11/7734* (2013.01); *H01L 25/167* (2013.01); *H01L 2224/48091* (2013.01); *H01L 2224/49107* (2013.01)

(58) Field of Classification Search
CPC . H01L 33/502; C09K 11/0883; C09K 11/616; C09K 11/7734
See application file for complete search history.

(56) References Cited

U.S. PATENT DOCUMENTS

| | | | |
|---|---|---|---|
| 8,890,403 B2* | 11/2014 | Sakuta | H01L 33/504 313/483 |
| 2015/0295144 A1* | 10/2015 | Weiler | H01L 33/504 362/84 |
| 2016/0049560 A1* | 2/2016 | Oh | H01L 33/504 257/98 |
| 2016/0330806 A1* | 11/2016 | Yamashita | H05B 33/0818 |

FOREIGN PATENT DOCUMENTS

| | | |
|---|---|---|
| CN | 102986044 A | 3/2013 |
| CN | 104781942 A | 7/2015 |
| CN | 105659397 A | 6/2016 |
| EP | 2629341 A1 | 8/2013 |
| JP | 2011089122 A | 5/2011 |
| TW | 201606401 A | 2/2016 |
| WO | 2015114958 A1 | 8/2015 |

* cited by examiner

*Primary Examiner* — C Melissa Koslow
(74) *Attorney, Agent, or Firm* — CKC & Partners Co., LLC

(57) ABSTRACT

A phosphor includes a europium-doped nitride phosphor powder and a manganese-doped fluoride phosphor powder. The weight ratio of the europium-doped nitride phosphor powder to the manganese-doped fluoride phosphor powder is in a range of 17.5% to 22.5%.

10 Claims, 5 Drawing Sheets

PHOSPHOR AND LIGHT EMITTING DEVICE AND BACKLIGHT MODULE INCLUDING THE SAME

CROSS-REFERENCE TO RELATED APPLICATION

This application claims priority to Taiwan Application Serial Number 105143982, filed Dec. 29, 2016, which is herein incorporated by reference.

BACKGROUND

Field of Invention

The present invention relates to a phosphor, light emitting device, and, backlight module including the same.

Description of Related Art

In the field of liquid crystal display, a continuous driving method used to be a main stream for driving a backlight module. However, recently, a periodical driving method, such as a scanning backlight, has been widely applied for increasing dynamic contrast of a display image.

In the periodical driving method, in general, when respective pixels of a liquid crystal panel are being driven, plural collaborating light sources are periodically driven in sequence, thereby enabling a backlight module to locally provide light to the front liquid crystal panel. As a result, the problem of motion blur resulted from displaying of motion pictures is prevented. However, while the backlight module using the periodical driving method may improve the used in a light source may still last for a short period after the light source is turned off, it turns out that a problem of light or image residue is incurred.

SUMMARY

According to some embodiments of the present invention, a phosphor includes a europium-doped nitride phosphor powder and a manganese-doped fluoride phosphor powder. A weight ratio of the europium-doped nitride phosphor powder to the manganese-doped fluoride phosphor powder is in a range from 17.5% to 22.5%.

In some embodiments of the present invention, an emission wavelength of the europium-doped nitride phosphor powder s greater than an emission wavelength of the manganese-doped fluoride phosphor powder.

In some embodiments of the present invention, the europium-doped nitride phosphor powder is formed from $Sr_2Si_5N_8:Eu^{2+}$.

In some embodiments of the present invention, the manganese-doped fluoride phosphor powder is formed from $K_2SiF_6:Mn^{4+}$.

According to some embodiments of the present invention, a light emitting device includes a light emitting body and the phosphor. The light emitting body is configured to emit light having a first spectrum. The phosphor is disposed at at least one side of the light emitting body, and the light having the first spectrum is converted into light having a second spectrum after passing through the phosphor.

In some embodiments of the present invention, an intensity ratio of the light having the second spectrum at a wavelength of 650 nanometers to the light having the second spectrum at a wavelength of 630 nanometers is about 0.1: 0.47.

In some embodiments he present invention, the light emitting body is a blue light emitting diode chip.

According to some embodiments of the present invention, a backlight module includes a back board, the light emitting devices, and a driver. The light emitting devices are disposed on the back board. The driver is electrically connected with the light emitting body of the light emitting devices.

In some embodiments of the present invention, the driver is configured to independently control a first portion of the light emitting devices and a second portion of the light emitting devices.

In some embodiments of the present invention, the driver is configured to control an intensity of the light having the first spectrum emitted from the light emitting body of the light emitting devices at a frequency greater than 60 Hz, thereby affecting an intensity of the light having the second spectrum.

It is to be understood that both t he foregoing general description and the following detailed description are by examples, and a intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
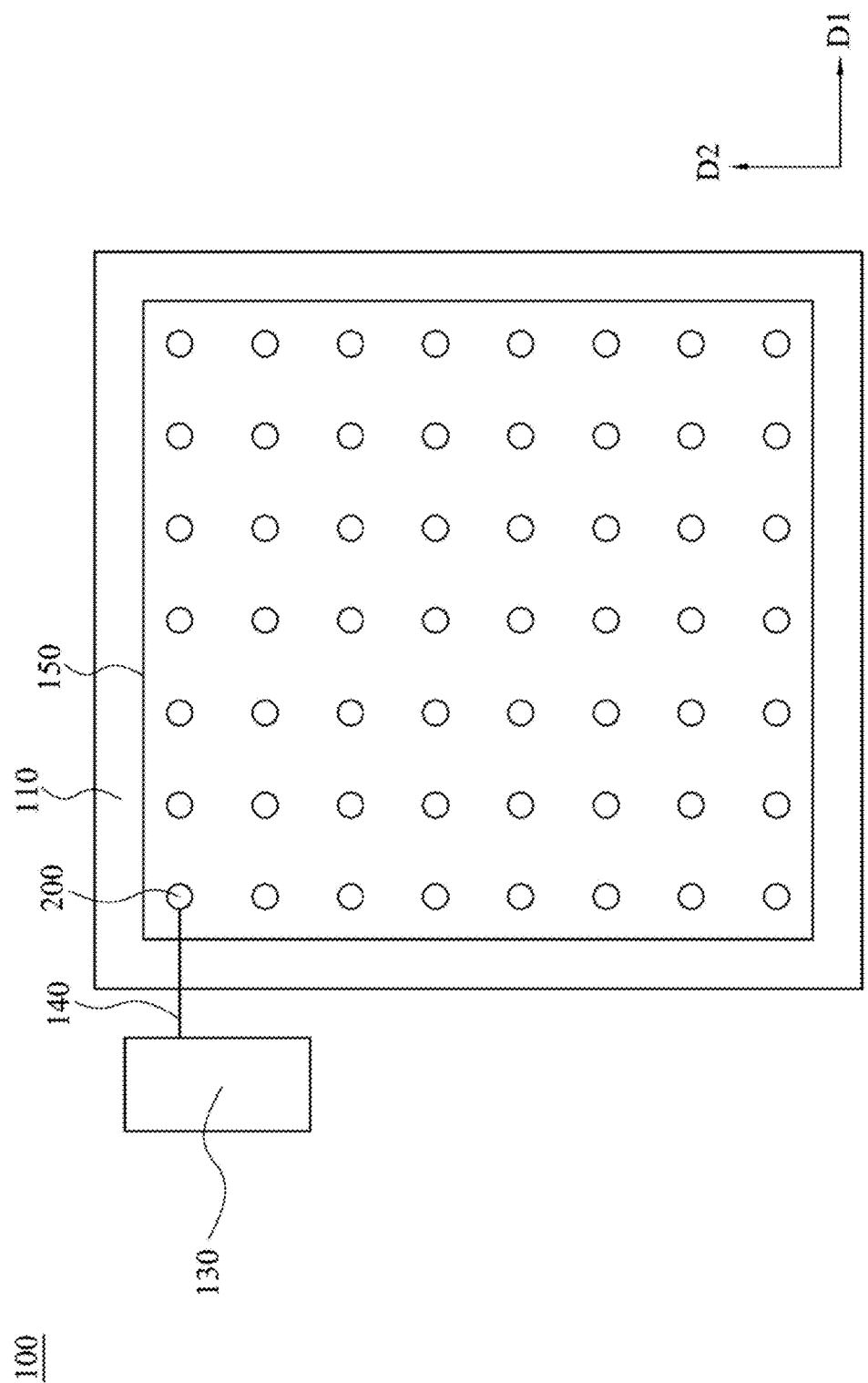
FIG. 1 is a schematic top view of a backlight module according to some embodiments of the present invention.

Reference will now be made in detail to the present embodiments of the invention, examples of which are illustrated in the accompanying drawings. Wherever possible, the same reference numbers are used in the drawings and the description to refer to the same or like parts.

FIG. 1 is a schematic top view of a backlight module 100 according to some embodiments of the present invention. The backlight module 100 includes a back board 110, light emitting devices 200, and a driver 130. The light emitting devices 200 are disposed in an array on the back board 110. For example, the light emitting devices 200 are arranged in an array along a first direction D1 and a second direction D2 perpendicular to the first direction D1. The driver 130 is electrically connected with the light emitting devices 200, so as to control the luminous intensity of the light emitting devices 200.

Figure 2:
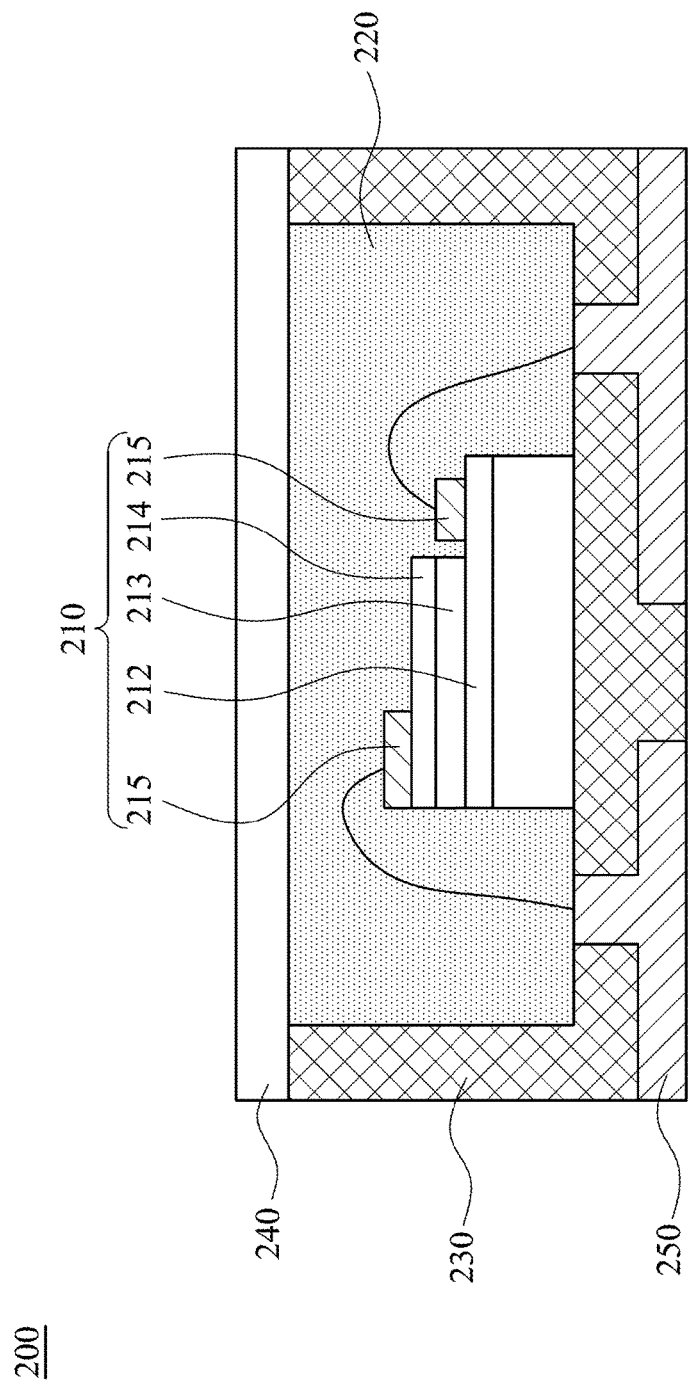
FIG. 2 is a schematic cross-sectional view of a light emitting device in FIG. 1.

FIG. 2 is a schematic cross-sectional view of one light emitting device 200 in FIG. 1. The light emitting device 200 includes a light emitting body 210 and a phosphor 220. The light emitting body 210 is configured to emit light having a first spectrum. The phosphor 220 is disposed around the light emitting body 210 (e.g., at at least one side of the light emitting body 210), so as to receive the light having the first spectrum. The phosphor 220 converts the light having the first spectrum into light having a second spectrum.

In some embodiments of the present invention, the light emitting device 200 is configured to emit light having an appropriate spectrum, such as white light. For example, in the present embodiment, the light emitting body 210 may be a blue light emitting diode chip, and the light having the first spectrum is blue light having a wavelength range from 440 to 450 nanometers (nm) The phosphor 220 may include at least one red phosphor powder. Through the configuration, the phosphor 220 may receive the light having the first spectrum with shorter wavelengths, and convert it into the light having the second spectrum with longer wavelengths, in which the light having the second spectrum includes red light.

In some embodiments of the present invention, the red phosphor powder includes europium-doped nitride phosphor powder and manganese-doped fluoride phosphor powder. In some embodiments, an emission wavelength of the europium-doped nitride phosphor powder is greater than an emission wavelength of the manganese-doped fluoride phosphor powder. For example, the two phosphor powders may be specified according to the wavelengths a which the maximum light intensity peaks occur, the wavelength corresponding to the maximum light intensity peak of the europium-doped nitride phosphor powder is greater that of the manganese-doped fluoride phosphor powder. However, the scope of the present invention shall not be limited thereto. In other embodiments, materials respectively containing the europium-doped nitride phosphor powder and the manganese-doped fluoride phosphor powder may be properly selected to avoid overlap of the wavelengths corresponding to maximum intensity peaks of the two kinds of phosphor powders.

For example, the manganese-doped fluoride phosphos powder is formed from KSF, which is $K_2SiF_6: Mn^{4+}$. An emission spectrum of KSF has the narrowest full width at half maximum (FWHM) and a light intensity peak at a wavelength of 630 nm. In some embodiments, the material of the europium-doped nitride phosphor powder may be $Sr_2Si_5N_8:Eu^{2+}$, $Ba_2Si_5N_8:Eu^{2+}$, $BaSi_7N_{10}:Eu^{2+}$, or a combination thereof, and emission spectrums of the materials may have intensity peaks in the vicinity of the wavelength 650 nm. For example, herein, the europium-doped nitride phosphor powder may be formed from $Sr_2Si_5N_8:Eu^{2+}$. Through the configuration by mixing KSF with the europium-doped nitride phosphor powder, the long wavelength portion of the red emission spectrum is supplemented, thereby improving red color saturation of the light having the second spectrum.

The following figure shows emission spectrums of two light emitting devices 200' and 200". Though the figure, a person with ordinary skill in the art may understand that light emitted from the light emitting device 200 in the embodiments of the present invention has better red color saturation.

Figure 3:
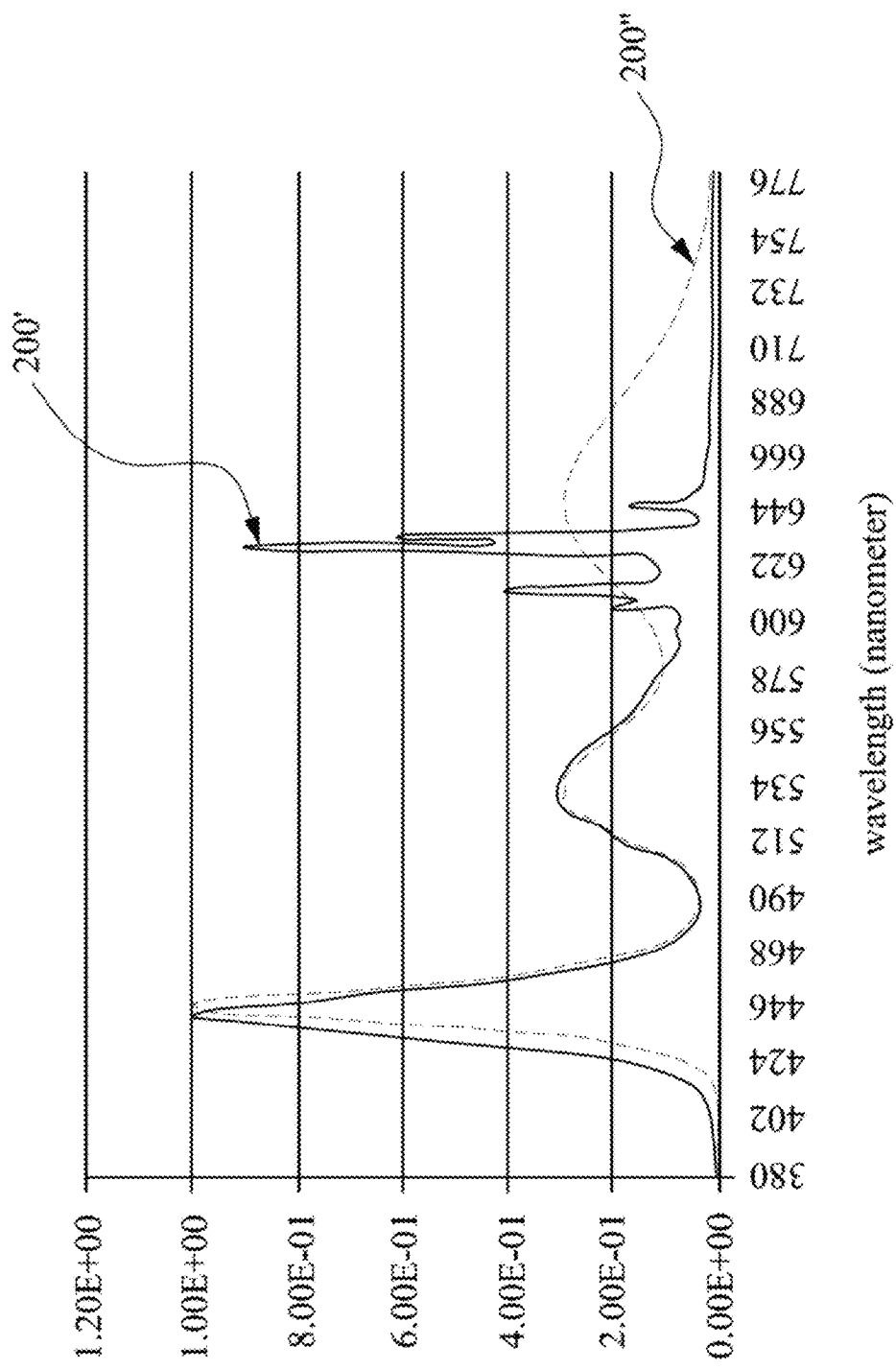
FIG. 3 shows emission spectrums of two light emitting devises according to some embodiments of the present invention.

FIG. 3 shows emission spectrums of two light emitting devices 200' and 200" according to some embodiments of the present invention. The horizontal axis represents the wavelength in nanometers, and the vertical axis represents the light intensity in voltage (the greater the light intensity, the greater the voltage measured by photo sensors). The light emitting devices 200' and 200" are similar to the light emitting device 200 of FIG. 2, but the difference is that the compositions of the phosphors in the light emitting devices 200', 200" are different from that of the light emitting device 200. To be specific, the light emitting device 200' includes a light emitting body and a phosphor, in which the phosphor includes at least one red phosphor powder containing manganese-doped fluoride phosphor powder (i.e., KSF) but no europium-doped nitride phosphor powder. The light emitting device 200" includes a light emitting body and a phosphor, in which the phosphor includes at least one red phosphor powder containing europium-doped nitride phosphor powder but no manganese-doped fluoride phosphor powder (i.e., KSF).

Through the configuration, within the red spectrum area, it is observed that the wavelength of the red light emitted from light emitting devices 200 is in a range from about 610 to 650 nm, and has the narrowest FWHM as well as en intensity peak at a wavelength of 630 nm. By contrast, the wavelength of the red light emitted from the light emitting device 200" is in a range of about 640 to 670 nm.

Again, reference is made to FIG. 1 and FIG. 2. Accordingly, the europium-doped nitride phosphor powder compensates for shortage of long wavelengths in the ion spectrum of the manganese-doped fluoride phosphor powder. A weight ratio of the manganese-doped fluoride phosphor powder to the europium-doped nitride phosphor in the phosphor 220 may be adjusted in terms of a suitable proportion, for enhancing color saturation of the light emitted from the phosphor 220.

In some embodiments of the present invention, in order to enable the backlight module 100 to apply a controlling method of a scanning, local dimming or high-dynamic range (HDR) scheme, the weight ratio of the europium-doped nitride phosphor to the manganese-doped fluoride phosphor powder in the phosphor 220 is designed to fall within an adequate range, thereby reducing the time period of light residue of the red phosphor powder.

Figure 4:
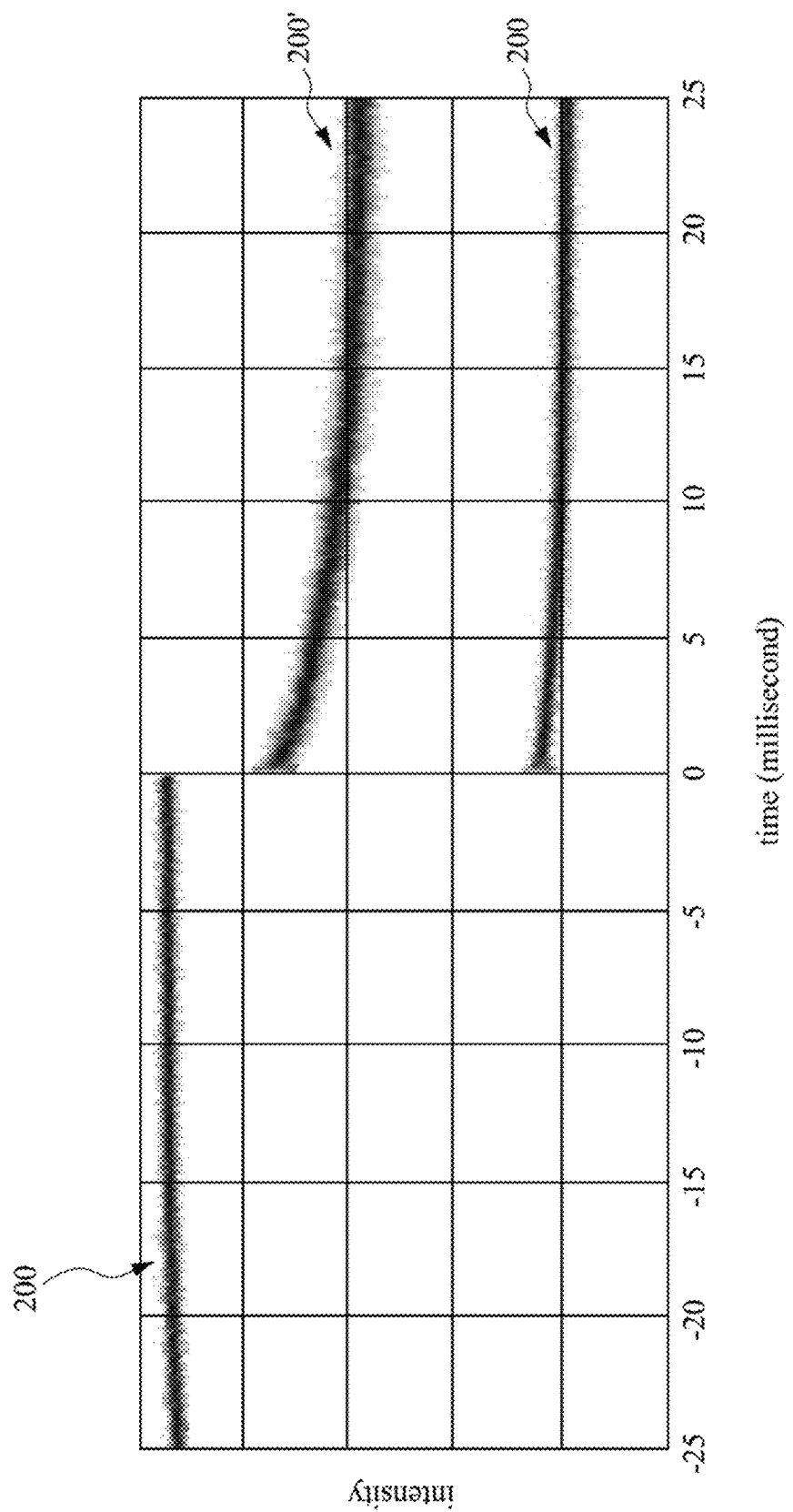
FIG. 4 shows measured intensity-versus-time plots of light emitted, from light emitting devices according to some embodiments of the present invention.

FIG. 4 shows measured intensity-versus-time plots of light emitted from light emitting devices according to some embodiments of the present invention. The two curves in the figure respectively show the measured intensity-versus-time result of the light emitting devices 200' including the phosphor completely composed of KSF and the measured intensity-versus-time result of the light emitting devices 200 including the phosphor comprising KSF and europium-doped nitride phosphor powder. In the figure, the horizontal axis represents time, and the scale of the horizontal axis is 5 millisecond (ms) per division. The vertical axis represents light intensity, and the scale of the vertical axis is 0.5 volts per division. As shown by the figure, the light emitting device 200' and the light emitting device 200 are turned off at the same time (i.e., at time of 0 millisecond). Due to the properties of materials, the phosphor containing $Mn^{4+}$ has a longer light residue time, and after the light emitting device 200' including the phosphor completely composed of KSF is turned off, it takes 25 ms (response time) for the light intensity of the light emitting device 200' to return to zero. Comparatively, it merely takes 10 ms (response time) for the light intensity of the light emitting device 200 including the phosphor including KSF and europium-doped nitride phosphor powder to be zero.

Through the figure, it is apparently observed that the light residue time of the light emitting device 200 including the phosphor comprising KSF and europium-doped nitride phosphor powder is less than that of the light emitting device 200' including the phosphor composed completely of KSF.

Figure 5:
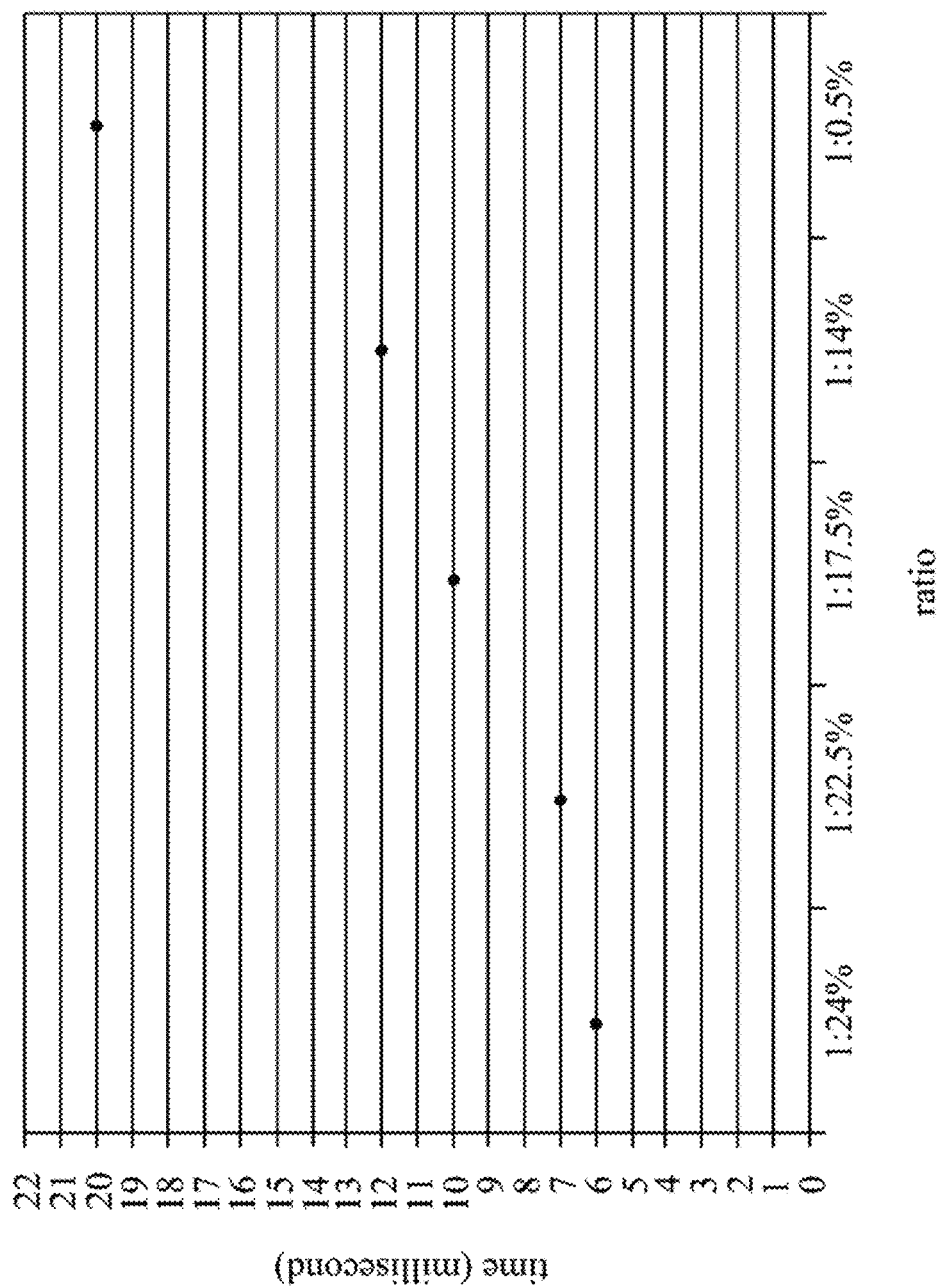
FIG. 5 illustrates response-time-versus-ratio plots of light emitting devices according to some embodiments of the present invention.

FIG. 5 illustrates response-time-versus-ratio plots of light emitting devices 200 according to some embodiments of the present invention. The vertical axis represents response time, and the horizontal axis represents weight ratio of the manganese-doped fluoride phosphor powder to the europium-doped nitride phosphor powder. As shown by the figure, the higher the proportion of the europium-doped nitride phosphor powder is, the shorter the response time is. In view of that human eyes perceive no flickers to frequencies higher than 60 hertz (i.e., 16.7 ms duration), the response time is less than 16 ms for providing excellent displaying performance given the weight ratio of the europium-doped nitride phosphor powder to the manganese-doped fluoride phosphor powder is in a range from 14% to 22.5%. Moreover, when the weight ratio of the europium-doped nitride phosphor powder to the manganese-doped fluoride phosphor powder is in a range from 17.5% to 22.5%, the light residue time is less than 10 ms, and thus resulting in a better display effect.

In the plural embodiments of the present invention, since $Eu^{2+}$ suppresses the light residue phenomenon caused by $Mn^{4+}$, the light residue time may be lowered by mixing the europium-doped nitride phosphor powder and the manganese-doped fluoride phosphor powder in a determined ratio, such that human eyes perceive no flickers. Herein, in the light emitting device 200 of FIG. 3, the weight ratio of the europium-doped nitride phosphor powder to KSF is in a range from 17.5% to 22.5%.

Affixing within the above weight ratio range, the light emitting device 200 emits the light having the second spectrum, and the ratio of the light intensity at the wavelength 650 nm to the light intensity at the wavelength 630 nm is 0.1:0.47. As a result, the europium-doped nitride phosphor powder compensates for shortage of long wavelengths in the emission spectrum of the manganese-doped fluoride phosphor powder, thereby enhancing color saturation of the light emitted from the phosphor 220.

In the present embodiments, in addition to red phosphor powder, the phosphor 220 may further include yellow phosphor powder, green phosphor powder, and so on, and the powders may be blended with transparent adhesives (e.g., resins) in appropriate proportions. The yellow phosphor powder and the green phosphor powder may be selected from suitable materials known in the art, which shall riot be detailedly recited herein. Alternatively, the phosphor 220 may only include the red phosphor powder blended with transparent adhesives (e.g., resins).

It is noted that the light emitting body 210 may be designed to emit any appropriate light, such as green light, violet light, and so on, but not limited to blue light. Accordingly, the materials of the phosphor 220 are selected to be capable of receiving the light from the light emitting body 210.

In some embodiments, the light emitting device 200 may further include a package shell 230, a sealant 240, and solder pads 250. In the present embodiments, the package shell 230 and the solder pads 250 are disposed on a substrate or a printed circuit board (not shown), and the light emitting body 210 is disposed in the package shell 230 and electrically connected with the solder pads 250 by wire bonding. To be specific electrodes 215 are disposed at a side of a first semiconductor layer 212, an active layer 213, and a second semiconductor layer 214 which is opposite to the solder pads 250, and electric wires electrically connect the electrodes 215 of the light emitting body 210 to the solder pads 250. Then, the package shell 230 is filled with the phosphor 220, and the light emitting body 210 and the phosphor 220 are sealed in the package shell 230 by the sealant 240. It is noted that, the configuration of the light emitting device is not limited to the figure, and the light emitting device 200 in may include any appropriate configuration. For example, additional reflective elements may further be incorporated within the package shell 230.

Reference is made back to FIG. 1. In the embodiments of the present invention, the backlight module 100 includes a printed circuit board 150 disposed on the back board 110, the light emitting devices 200 may be disposed on the printed circuit board 150 the electric wire 140 connects the printed circuit board 150 and the driver 130, such that the light emitting devices 200 on the printed circuit board 150 are electrically connected with the driver 130. Herein, for brief illustration, connections between the light emitting devices 200 and the driver 130 are not all depicted, but one with ordinary skill should understand the connections. For example, the electric wire 140 and circuit structures (not shown) of the printed circuit board 150 may electrically connect each of the light emitting devices 200 to the driver 130, such that the driver 130 may supply electric currents to the light emitting devices 200 respectively.

In the embodiments of the present invention, the driver 130 is suitable for controlling, at a frequency higher than 60 hertz, the intensity of the light having the first spectrum emitted from the light emitting body 210 of the light emitting devices 200 thereby affecting the intensity of the light having the second spectrum. As aforementioned, since the light residue time of the light emitting devices 200 may be less than 16 milliseconds even further less than 10 milliseconds, the backlight module 100 may apply to a scanning, local dimming, or high-dynamic range (HDR) backlight control scheme.

To be specific, herein, the light emitting devices 200 are disposed in full-array, and the driver 130 is suitable for independently controlling the light intensity of each of the light emitting devices 200, and it is more easy to perform a two-dimensional scanning, local dimming or high-dynamic range (HDR) backlight control scheme.

In other embodiments, the driver 130 is suitable for independently controlling light intensities of a first portion and a second portion of the light emitting devices 200, so as to locally adjust the light of the backlight module 100. For example, the light emitting devices 200 comprises multiple light bars, and the driver 130 is suitable for independently control ling the light intensity of the light emitting devices 200 on each of the light bars. Specifically, the light emitting devices 200 on one of the light bars are turned on, while the light emitting devices 200 on another one of the light bars are turned off, which is one-dimensional local dimming backlight control scheme.

In other cords, in some embodiments, each of the light, emitting devices 200 may be independently electrically connected with the driver 130. Alternatively, in other embodiments, the light emitting devices 200 may be divided into plural groups, and the light emitting devices 200 of each group are all together electrically connected with the driver 130.

Moreover, in some embodiments of the present invention, the backlight module 100 may further include reflective elements (not shown) and optic films (not shown). The reflective elements may enhance light flux from the light emitting devices 200. The optic films includes diffusor plates, brightness enhancement films (BEE), and diffusor sheets, and may improve the uniformity of light emitted from the light emitting devices 200.

Other details of the present embodiments are similar to those illustrated above and not repeated herein.

In the plural embodiments of the present invention, by mixing the europium-doped nitride phosphor powder and the manganese-doped fluoride phosphor powder in an appropriate ratio for forming the phosphor, the red color saturation of the light emitted from the phosphor is enhanced, and the light residue time of the phosphor is reduced. Accordingly, the light emitting devices and backlights using the phosphor exhibit excellent display effect when the high dynamic range function is enabled.

Although the present invention has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. A phosphor, comprising:
   a red phosphor powder, comprising:
      a europium-doped nitride phosphor powder; and
      a manganese-doped fluoride phosphor powder, wherein a weight ratio of the europium-doped nitride phosphor powder to the manganese-doped fluoride phosphor powder is in a range from 17.5% to 22.5%.

2. The phosphor of claim 1, wherein an emission wavelength of the europium-doped nitride phosphor powder is greater than an emission wavelength of the manganese-doped fluoride phosphor powder.

3. The phosphor of claim 1, wherein the europium-doped nitride phosphor powder is formed from $Sr_2Si_5N_8:Eu^{2+}$.

4. The phosphor of claim 1, wherein the manganese-doped fluoride phosphor powder is formed from $K_2SiF_6:Mn^{4+}$.

5. A light emitting device, comprising:
   a light emitting body configured to emit light having a first spectrum; and
   the phosphor of claim 1, wherein the phosphor is disposed at at least one side of the light emitting body, wherein the light having the first spectrum is converted into light having a second spectrum after passing through the phosphor.

6. The light emitting device of claim 5, wherein an intensity ratio of the light having the second spectrum at a wavelength of 650 nanometers to the light having the second spectrum at a wavelength of 630 nanometers 0.1:0.47.

7. The light emitting device of claim 5, wherein the light emitting body is a blue light emitting diode chip.

8. A backlight module, comprising:
   a back board;
   a plurality of the light emitting devices of claim 6, wherein the light emitting devices are disposed on the back board; and
   a driver electrically connected with the light emitting body of each of the light emitting devices.

9. The backlight module of claim 8, wherein the driver is configured to independently control a first portion of the light emitting devices and a second portion of the light emitting devices.

10. The backlight module of claim 8, wherein the driver is configured to control an intensity of the light having the first spectrum emitted from the light emitting body of each of the light emitting elements by using a frequency greater than 60 Hz, thereby affecting an intensity of the light having the second spectrum.

* * * * *